United States Patent
Huang

(10) Patent No.: US 12,348,135 B2
(45) Date of Patent: Jul. 1, 2025

(54) POWER CIRCUIT, DRIVING CIRCUIT AND METHOD FOR PROVIDING DRIVING VOLTAGE

(71) Applicant: Monolithic Power Systems, Inc., Kirkland, WA (US)

(72) Inventor: Chun-Shih Huang, New Taipei (TW)

(73) Assignee: Monolithic Power Systems, Inc., Kirkland, WA (US)

( * ) Notice: Subject to any disclaimer, the term of this patent is extended or adjusted under 35 U.S.C. 154(b) by 96 days.

(21) Appl. No.: 18/477,018

(22) Filed: Sep. 28, 2023

(65) Prior Publication Data
US 2024/0022241 A1 Jan. 18, 2024

(30) Foreign Application Priority Data
Oct. 5, 2022 (TW) .................................. 111137913

(51) Int. Cl.
| | |
|---|---|
| *H02M 3/158* | (2006.01) |
| *H02M 1/00* | (2006.01) |
| *H02M 1/08* | (2006.01) |
| *H02M 1/32* | (2007.01) |
| *H02M 3/156* | (2006.01) |
| *H03K 17/082* | (2006.01) |
| *H03K 17/687* | (2006.01) |

(52) U.S. Cl.
CPC ....... *H02M 3/1566* (2021.05); *H02M 1/0038* (2021.05); *H02M 1/08* (2013.01); *H02M 1/32* (2013.01); *H02M 3/158* (2013.01); *H03K 17/0822* (2013.01); *H03K 17/6871* (2013.01)

(58) Field of Classification Search
CPC .......... H03K 17/0822; H03K 17/6871; H02M 1/0038; H02M 1/08; H02M 1/32; H02M 3/1566–158
See application file for complete search history.

(56) References Cited

U.S. PATENT DOCUMENTS

| | | | |
|---|---|---|---|
| 7,502,719 B2 | 3/2009 | Moraveji | |
| 8,269,474 B2 | 9/2012 | Kleine | |
| 8,917,074 B2 | 12/2014 | Luo et al. | |
| 9,857,854 B2 * | 1/2018 | Zhang | .................. H02M 3/158 |
| 10,727,742 B2 | 7/2020 | Chen et al. | |
| 11,569,744 B2 * | 1/2023 | Ragona | ............... H02M 1/0032 |

* cited by examiner

Primary Examiner — Patrick O Neill
(74) Attorney, Agent, or Firm — Perkins Coie LLP

(57) ABSTRACT

A power circuit includes a first switch, a second switch, and a driving circuit. A first terminal of the first switch is configured to receive an input voltage. A first terminal of the second switch is coupled to a second terminal of the first switch, and a second terminal of the second switch is configured to be coupled to a ground. The driving circuit receives a PWM control signal, and provides a first driving signal to a control terminal of the first switch and a second driving signal to a control terminal of the second switch based on the PWM control signal. The driving circuit determines whether the PWM signal is at a high impedance logic level. When the PWM signal is at the high impedance logic level, the driving circuit regulates a voltage of the second driving signal such that the second driving switch operate in linear region.

20 Claims, 7 Drawing Sheets

US 12,348,135 B2

POWER CIRCUIT, DRIVING CIRCUIT AND METHOD FOR PROVIDING DRIVING VOLTAGE

CROSS-REFERENCE TO RELATED APPLICATIONS

This application claims priority to and the benefit of Taiwan Patent application No. 111137913, filed on Oct. 5, 2022, which is incorporated herein by reference in its entirety.

FIELD

The present invention relates generally to electronic circuits, and more particularly but not exclusively to driving circuits of voltage regulator and power circuits.

BACKGROUND

A conventional voltage regulation circuit 100 is shown in FIG. 1. The voltage regulation circuit 100 includes a transistor M1, a transistor M2, an inductor L, a driving circuit 110, and a feedback control circuit 120. As shown in FIG. 1, the voltage regulation circuit 100 is a buck converter. The driving circuit 110 receives a Pulse-Width Modulation (PWM) control signal $S_{PWM}$, and provides a driving signal G1 to the control terminal of the transistor M1 and a driving signal G2 to the control terminal of the transistor M2 based on the PWM control signal $S_{PWM}$. The first terminal of the transistor M1 is coupled to a voltage source (e.g., input voltage terminal Vin), the second terminal of the transistor M1 is coupled to the first terminal of the transistor M2 (e.g., switching terminal SW), the second terminal of the transistor M2 is coupled to a reference ground GND. The transistor M1 is turned on and turned off alternately in response to the driving signal G1. An output capacitor Cout is coupled to an output voltage terminal Vout to filter an output voltage. The feedback control circuit 120 provides the PWM control signal $S_{PWM}$ to the driving circuit 110 in response to the output voltage.

When the voltage regulation circuit transitions from heavy load to light load, during the energy stored in the inductor transferring to the output capacitor, voltage spikes may occur before the output voltage reaches a steady state, which may damage devices. In some cases, a capacitor having a large capacitance could be used to suppress the voltage spikes, however, it results in higher cost and larger size of the entire circuit.

Another method to mitigate the voltage spikes is by turning off the low side transistor M2 to turn on the body diode of the transistor M2, thereby decreasing the current flowing through the inductor with a higher rate to avoid the voltage spikes. However, the conduction of the body diode may cause the substrate current injection issue, which may affect the electrical characteristics of the switch, and further affect the system performance.

SUMMARY

According to an embodiment of the present invention, a power circuit is provided. The power circuit includes a first switch, a second switch, and a driving circuit. The first switch has a first terminal, a second terminal, and a control terminal. The first terminal of the first switch is configured to receive an input voltage. The second switch has a first terminal, a second terminal, and a control terminal. The first terminal of the second switch is coupled to the second terminal of the first switch, and the second terminal of the second switch is configured to be coupled to a ground. The driving circuit is configured to receive a Pulse-Width Modulation (PWM) control signal, and to provide a first driving signal to the control terminal of the first switch and to provide a second driving signal to the control terminal of the second switch based on the PWM control signal. The driving circuit is further configured to determine whether the PWM control signal is at a high impedance logic level. When the PWM control signal is at a low logic level, the driving circuit is further configured to provide the second driving signal with a first level to the second switch to turn on the second switch. When the PWM control signal is at a high logic level, the driving circuit is further configured to provide the second driving signal with a second level to the second switch to turn off the second switch. When the PWM control signal is at the high impedance logic level, a voltage of the second driving signal is regulated to make the second switch operate in a linear region.

In one embodiment, the second switch includes a transistor having a body diode. When the PWM control signal is at the high impedance logic level, a voltage across the second switch is lower than a forward conduction voltage of the body diode.

According to another embodiment of the present invention, a driving circuit for a voltage regulation circuit is provided. The driving circuit includes a tri-state detection circuit and a control circuit. The tri-state detection circuit is configured to receive a PWM control signal and to determine whether a voltage of the PWM control signal is between a first voltage threshold and a second voltage threshold. When the PWM control signal is between the first voltage threshold and the second voltage threshold, the tri-state detection circuit determines the PWM control signal is at a high impedance logic level and provides a tri-state signal. The first voltage threshold is lower than the second voltage threshold, the first voltage threshold indicates a low logic level, and the second voltage threshold indicates a high logic level. The control circuit is configured to receive the PWM control signal and to provide a first driving signal to a first switch of the voltage regulation circuit and provide a second driving signal to a second switch of the voltage regulation circuit based on the PWM control signal. When the PWM control signal is at the low logic level, the control circuit is configured to provide the second driving signal with a first level to turn on the second switch. When the PWM control signal is at the high logic level, the control circuit is configured to provide the second driving signal with a second level to turn off the second switch. The control circuit is configured to regulate a voltage of the second driving signal to make the second switch operate in the linear region based on the tri-state signal.

According to yet another embodiment of the present invention, a method for providing a driving voltage is provided. The method includes the following steps. A PWM control signal is received. Whether the PWM control signal is at a high impedance logic level is determined. A driving signal is provided to a switch based on the PWM control signal. When the PWM control signal is at a low logic level, the driving signal with a first level is provided to turn on the switch. When the PWM control signal is at a high logic level, the driving signal with a second level is provided to turn off the switch. When the PWM control signal is at the high impedance logic level, a voltage of the driving signal is regulated to make the switch operate in a linear region.

BRIEF DESCRIPTION OF THE DRAWINGS

The present invention can be further understood with reference to the following detailed description and the appended drawings.

DETAILED DESCRIPTION

Various embodiments of the present invention will be described in detail below, and it should be noted that the embodiments described here are only for illustration. However, the present invention is not limited thereto. In the following description, numerous specific details, such as example circuits and example values for these circuit components, and methods are illustrated in order to provide a thorough understanding of the present invention. It will be apparent for persons having ordinary skill in the art that the present invention can be practiced without one or more specific details, or with other methods, components, materials. In other instances, well-known circuits, materials or methods are not shown or described in detail in order to avoid obscuring the present invention.

Throughout this description, the phrases "in one embodiment", "in an embodiment", "in some embodiments", "in an example", "in some examples", "in one implementation", and "in some implementations" as used to include both combinations and sub-combinations of various features described herein as well as variations and modifications thereof. These phrases used herein does not necessarily refer to the same embodiment, although it may. It is noted that when an element is "connected to" or "coupled to" the other element, it means that the element is directly connected to or coupled to the other element, or indirectly connected to or coupled to the other element via another element. The switches described herein are Metal-Oxide-Semiconductor Field-Transistors (MOSFETs), and each MOSFET has a first terminal (e.g., drain), a second terminal (e.g., source), and a control terminal (e.g., gate). Persons having ordinary skill in the art will understand that the switches could be other suitable devices, and the connection of the switches could be changed accordingly. Additionally, persons having ordinary skill in the art will understand that the drawings provided herein are for illustrative purposes and are not necessarily drawn to scale.

Figure 1:
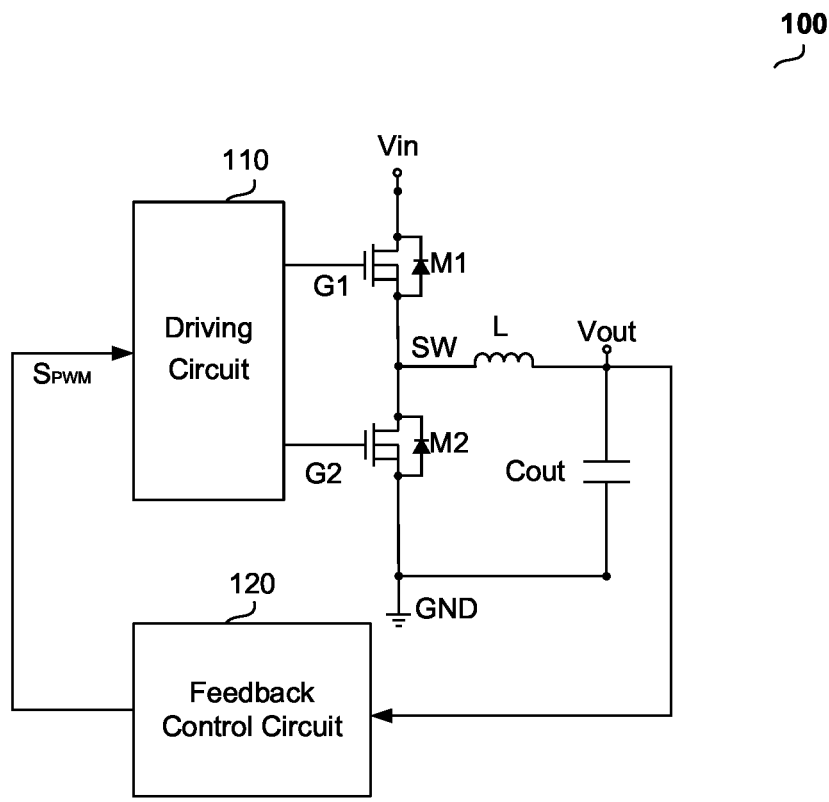
FIG. 1 schematically shows a conventional voltage regulation circuit.
Figure 2:
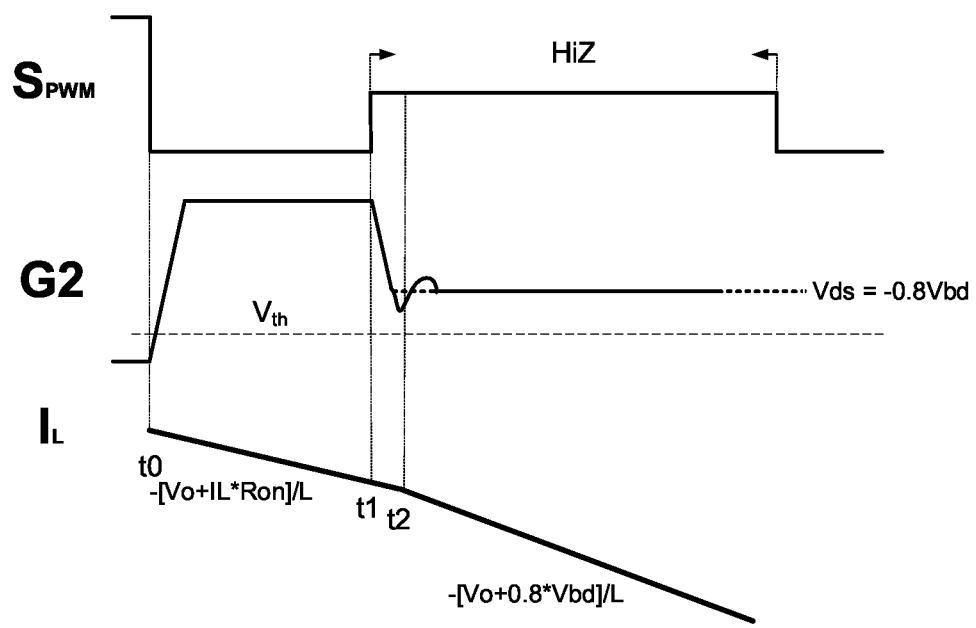
FIG. 2 schematically shows simulated waveforms of signals of a driving circuit in accordance with an embodiment of the present invention.

In one embodiment of the present invention a driving circuit for driving power switches is provided. FIG. 2 shows simulated waveforms of signals of the driving circuit in accordance with an embodiment of the present invention. In this embodiment, the driving circuit could be realized by the driving circuit 110 applied in a voltage regulation circuit 100 as shown in FIG. 1. The driving circuit 110 is configured to receive the PWM control signal $S_{PWM}$, and to provide the driving signal G2 to the control terminal of the power switch (e.g., transistor M2). The transistor M2 is turned on and turned off alternately in response to the driving signal G2. In one embodiment, a high side switch (e.g., transistor M1) and a low side switch (e.g., transistor M2) are N-type MOSFETs having a first terminal (e.g., drain), a second terminal (e.g., source), and a control terminal (e.g., gate). The driving signal G2 (e.g., a voltage signal $V_{GS(LS)}$) is provided to the gate terminal of the transistor M2. When the driving signal G2 is at a high voltage level ($V_{GS(LS)} \geq Vth$), the transistor M2 is turned on, and when the driving signal G2 is at a low voltage level ($V_{GS(LS)} < Vth$), the transistor M2 is turned off.

The driving circuit 110 is further configured to determine whether the PWM control signal is at a high impedance logic level. To be specific, the PWM control signal $S_{PWM}$ has three states, for example, a high logic level, a low logic level, and the high impedance (HiZ) logic level. When the PWM control signal $S_{PWM}$ is at the high logic level, the high side switch (e.g., transistor M1) is turned on and the voltage regulation circuit 100 is considered to be in the on-state. When the PWM control signal $S_{PWM}$ is at the low logic level, the low side switch (e.g., transistor M2) is turned on and the voltage regulation circuit 100 is considered to be in the off-state. When the PWM control signal $S_{PWM}$ is at the high impedance logic level (or in a tri-state region), the voltage regulation circuit 100 is considered to be in the high impedance state or inactive state.

As shown in FIG. 2, at time t0, the driving circuit receives PWM control signal $S_{PWM}$ at the low logic level, and provides the high level driving signal G2 accordingly. During time t0-t1, the transistor M1 is turned off and the transistor M2 is turned on, the inductor discharges, and thus the current flowing through the inductor (i.e., $I_L$) gradually decreases. At time t1, the driving circuit receives PWM control signal $S_{PWM}$ at the high impedance logic level, and regulates the driving signal G2 accordingly such that the transistor M2 operates in the linear region. As shown in FIG. 2, at time t1, the voltage of the driving signal G2 starts to decrease. At time t2, the voltage of the driving signal G2 deceases to a target value that allows the transistor M2 to operate in the linear region. In other words, the voltage of the driving signal G2 is regulated to meet the requirements: $V_{GS(LS)} > Vth$ and $V_{DS(LS)} < V_{GS(LS)} - Vth$. By regulating the driving signal G2 to make the voltage across the transistor M2 (i.e., the drain-source voltage $V_{DS(LS)}$) lower than the forward conduction voltage Vbd when the body diode of the transistor M2 is conducted, for example, $V_{DS(LS)} = -0.8 \times Vbd$, the current will not flow through the body diode (i.e., flowing into the substrate). In one embodiment, when the drain-source current IDS is 25 A, the forward conduction voltage Vbd is 0.7V. According to practical applications, the forward conduction voltage Vbd of the body diode of the transistor M2 may vary with different operating voltages and temperatures, and thus the drain-source voltage $V_{DS(LS)}$ of the transistor M2 could be regulated accordingly. When the transistor M2 operates in the linear region (after time t2), the transistor M2 functions as a variable resistor. Since the on-resistance (i.e., $R_{DS(on)}$) of the transistor M2 in the linear region has a higher resistance than the on-resistance in the saturation region (i.e., $R_{DS(on\_sat)}$), the current flowing through the inductor (i.e., $I_L$) is decreased in a higher slew rate, and therefore the current flowing to the output capacitor could be decreased faster to suppress the voltage spikes.

When the driving circuit and the power transistors M1 and M2 are integrated into a same die, the inductor current $I_L$ could be decreased at a higher slew rate by turning on the body diode of the transistor M2. However, such a large current flows through the substrate for a long time may cause the substrate current injection issue. In contrast, the driving circuit of the present invention is provided to suppress the voltage spikes by regulating the voltage of driving signal G2 such that the transistor M2 operates in the linear region.

In one embodiment, the feedback control circuit 120 includes an error amplifier to compare the output voltage Vout with a reference voltage Vref, and to regulate the drain-source voltage $V_{DS(LS)}$ based on the comparison result.

In one embodiment, the high voltage level (logic "1") of the PWM control signal $S_{PWM}$ is between a high voltage threshold (e.g., 2V) and a power supply voltage VCC (e.g., 3.3V), the low voltage level (logic "0") of the PWM control signal $S_{PWM}$ is between zero voltage (0V) and a low voltage threshold (e.g., 1V), while the tri-state region (e.g., the high impedance logic level) is between the low voltage threshold and the high voltage threshold (e.g., between 1V and 2V).

Figure 3:
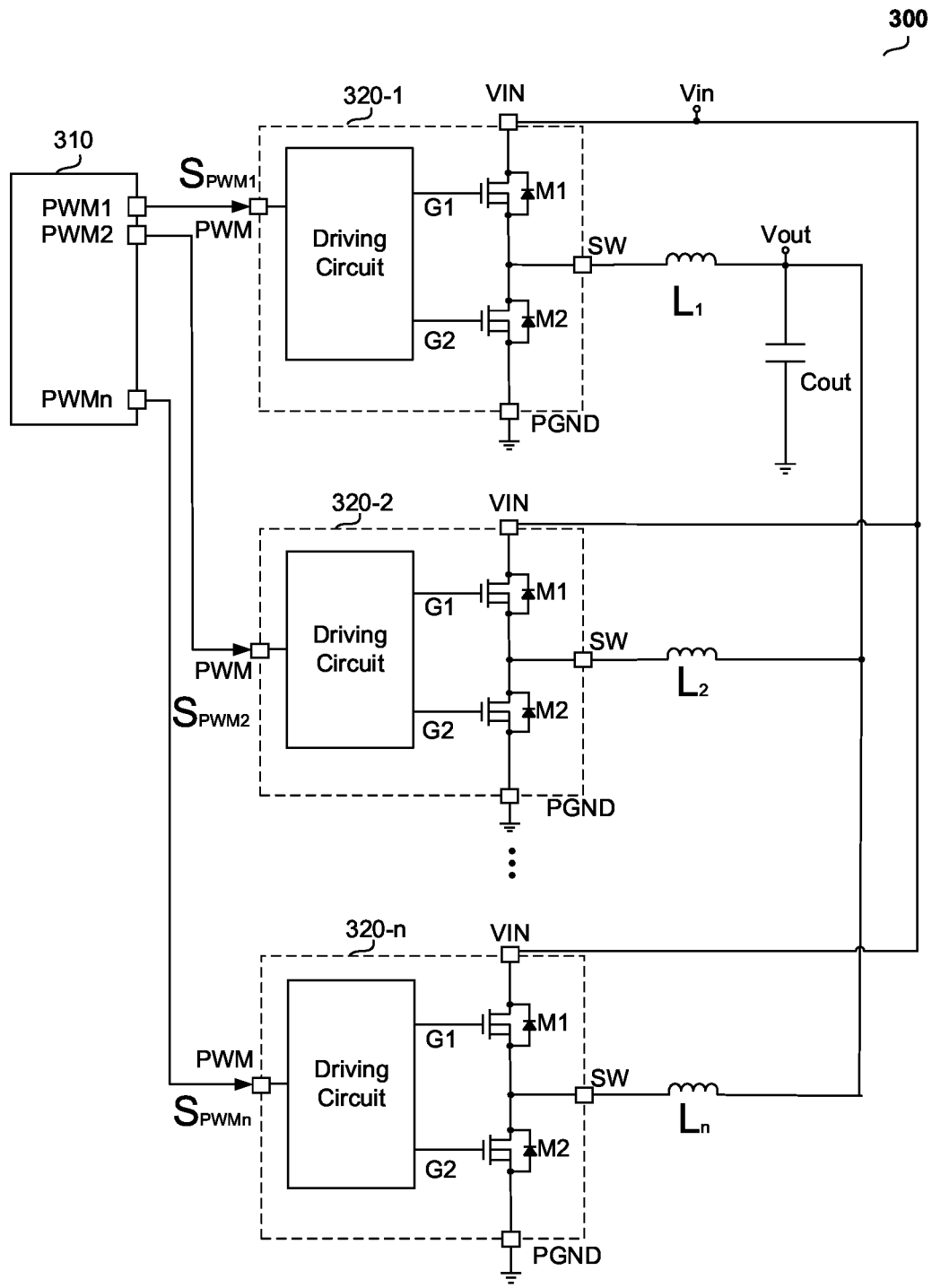
FIG. 3 schematically shows a multi-phase voltage regulation circuit in accordance with an embodiment of the present invention.

FIG. 3 schematically shows a multi-phase voltage regulation circuit 300 in accordance with an embodiment of the present invention. The multi-phase voltage regulation circuit 300 includes a controller 310 and n power circuits 320-1, 320-2, 320-3 . . . , 320-n, where n is a natural number greater than or equal to 2. In one embodiment, each one of the power circuits 320 provides one phase of the multi-phase voltage regulation circuit 300.

In one embodiment, the controller 310 is an integrated circuit and each one of the power circuits 320 is an integrated circuit. As shown in FIG. 3, the controller 310 includes n PWM pins (PWM1, PWM1, . . . , PWMn) to provide n PWM control signals $S_{PWM1}$, $S_{PWM2}$, . . . , $S_{PWMn}$ to n power circuits 320-1, 320-2, 320-3 . . . 320-n respectively for controlling the corresponding power circuits 320. For example, the controller 310 provides the PWM control signals $S_{PWM1}$ to power circuit 320-1 through the PWM pin PWM1, provides the PWM control signals $S_{PWM2}$ to power circuit 320-2 through the PWM pin PWM2. Each one of the power circuits 320 includes the driving circuit and the transistors M1 and M2. Each one of the power circuits 320 further includes a PWM pin, a VIN pin, a SW pin, and a PGND pin. Each one of the PWM pins of the power circuits 320-1, 320-2, 320-3 . . . 320-n receives the corresponding PWM control signal $S_{PWM}$. For example, the PWM pin of the power circuit 320-1 receives the PWM control signal $S_{PWM1}$, the PWM pin of the power circuit 320-2 receives the PWM control signal $S_{PWM2}$. Each one of the VIN pins is coupled to the voltage source terminal Vin to receive an input voltage synchronously. Each one of the PGND pins is coupled to the reference ground. Each one of the SW pins is coupled to the output voltage terminal Vout through the corresponding inductor of the inductors L1, L2, . . . , Ln, to provide the output voltage to a load.

In one embodiment, each phase provides the corresponding output current respectively, and the n phase connected in parallel could be switched synchronously to provide a total large output current to meet the load requirements, and to decrease the input and output ripple at the same time. In another embodiment, the output current of each phase could be adjusted based on the load requirements.

In one embodiment, the controller 310 detects feedback signals, and regulates the PWM control signals to control the power circuits 320 based on the detected feedback signals. The feedback signals may be the output voltage or output current. In another embodiment, the multi-phase voltage regulation circuit 300 further includes a feedback circuit (not shown). The feedback circuit provides the feedback signals to the controller 310. The controller 310 provides the PWM control signal to regulate the operating state of the power circuits 320 based on the received feedback signals. In yet another embodiment, the feedback signals could be sent back to the controller 310 through the power circuits 320, so that the PWM control signals provided to the power circuits 320 could be regulated by the controller 310. In some embodiments, the PWM control signals provided to the power circuits 320 are regulated by the controller 310 based on the returned data provided by the power circuits 320. In some embodiments, the data may include temperature information, current signals, voltage signals, fault signals, and other detecting signals.

In one embodiment, when the load transitions from heavy load to light load, the controller 310 sends a HiZ command, for example, the PWM control signal $S_{PWM}$ at the high impedance logic level. In another embodiment, when the controller 310 detects the output voltage spikes, the controller 310 sends the HiZ command. In one embodiment, the controller 310 sends n HiZ commands to each one of the power circuits 320-1, 320-2, . . . , 320-n through the corresponding PWM pins (PWM1, PWM1, . . . , PWMn). In another embodiment, the controller 310 sends the HiZ commands to at least one of the power circuits 320 through the corresponding PWM pins. According to practical applications, the controller 310 may send the HiZ commands to the each phase of the power circuits 320 through the corresponding PWM pins simultaneously. Alternatively, the HiZ commands are sent to the each phase of the power circuits 320 after a certain delay.

When the corresponding driving circuit (e.g., the i'th driving circuit, where i is a natural number and receives the PWM control signal $S_{PWMi}$ at the high impedance logic level, the voltage of the driving signal G2 is regulated accordingly such that the corresponding transistor M2 operates in the linear region. The value of the drain-source voltage $V_{DS(LS)}$ is controlled within a limited range, and thus to prevent the current flowing through the body diode (i.e., flowing into the substrate).

Figure 4:
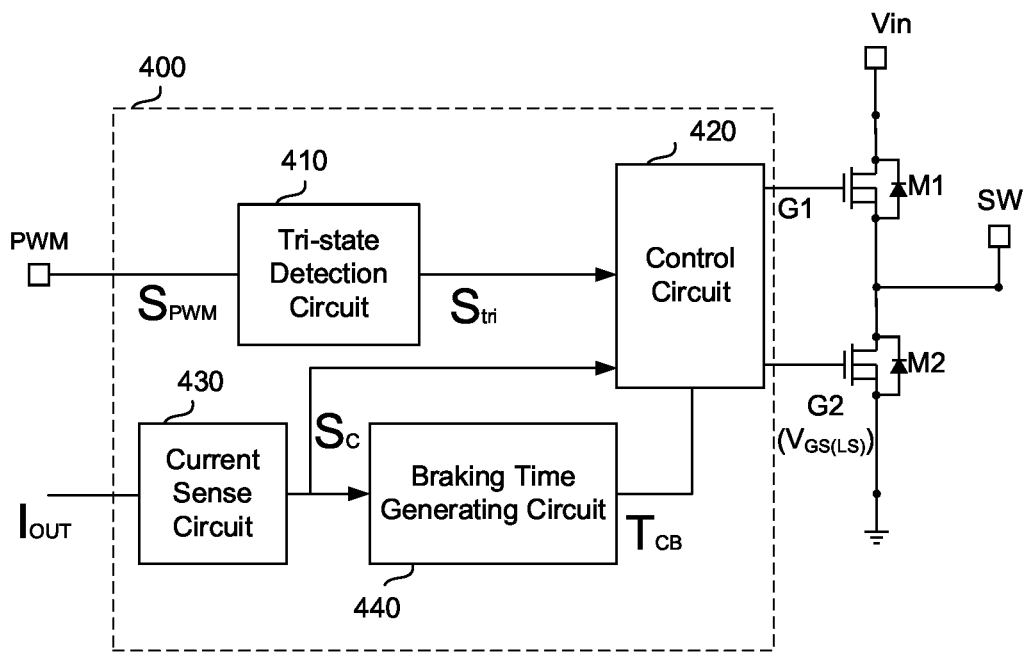
FIG. 4 schematically shows a power circuit shown in FIG. 3 in accordance with an embodiment of the present invention.

FIG. 4 schematically shows a power circuit 320 shown in FIG. 3 in accordance with an embodiment of the present invention. As shown in FIG. 4, the power circuit 320 includes a driving circuit 400 and transistors M1, M2. The driving circuit 400 includes a tri-state detection circuit 410. The tri-state detection circuit 410 is configured to receive the PWM control signal $S_{PWM}$, and to determine whether the PWM control signal $S_{PWM}$ is at the tri-state region (e.g., the high impedance logic level). When the tri-state detection circuit 410 determines that the PWM control signal $S_{PWM}$ is at the tri-state region, the tri-state detection circuit 410 provides a tri-state signal $S_{tri}$. In one embodiment, for example, when the transistor M2 is a NMOS, the transistor M2 is turned on in response to the high voltage level driving signal G2, and turned off in response to the low voltage level driving signal G2, and controlled to operate in the linear region in response to the driving signal G2 with the voltage level of the tri-state region. In one embodiment, a first voltage threshold indicates the PWM control signal $S_{PWM}$ at the low logic level, and a second voltage threshold indicates the PWM control signal $S_{PWM}$ at the high logic level, the voltage between the first voltage threshold and the second voltage threshold indicates the PWM control signal $S_{PWM}$ at high impedance logic level. For example, the high voltage level (logic "1") of the PWM control signal $S_{PWM}$ is between the high voltage threshold (e.g., 2V) and the power supply voltage VCC (e.g., 3.3V), the low voltage level (logic "0") of the PWM control signal $S_{PWM}$ is between zero voltage (0V) and the low voltage threshold (e.g., 1V), while the PWM control signal $S_{PWM}$ at the high impedance logic level is between the low voltage threshold and the high voltage threshold (e.g., between 1V and 2V). Persons having ordinary skill in the art will understand that the high voltage threshold and the low voltage threshold could be set according to practical applications, and more voltage thresholds could be applied to distinguish the driving signal with different logic level for controlling the operating state of the power switch.

In one embodiment, the driving circuit 400 further includes a control circuit 420. The control circuit 420 is configured to generate the driving signal G1 and the driving signal G2. When the control circuit 420 receives the tri-state signal $S_{tri}$ indicating the PWM control signal $S_{PWM}$ at the high impedance logic level, the control circuit 420 regulates the voltage value of the driving signal G2 (i.e., $V_{GS(LS)}$) to control the transistor M2 to operate in the linear region. In other words, the driving signal G2 is regulated to meet the requirements: $V_{GS(LS)}>Vth$ and $V_{DS(LS)}<V_{GS(LS)}-Vth$. For example, by regulating the driving signal G2 to make the voltage across the transistor M2 (i.e., the drain-source voltage $V_{DS(LS)}$) lower than the forward conduction voltage Vbd when the body diode of the transistor M2 is conducted, for example, $V_{DS(LS)}=-0.8 \times Vbd$. In one embodiment, when the drain-source current IDS is 25 A, the forward conduction voltage Vbd is 0.7V.

In another embodiment, the driving circuit 400 further includes a current sense circuit 430 configured to sense a current signal Sc. In one embodiment, the current signal Sc indicates the current $I_L$ flowing through the inductor. In another embodiment, the current signal Sc indicates the output current $I_{OUT}$. The control circuit 420 performs the zero current detection (ZCD) based on the current signal Sc. To be specific, the control circuit 420 determines whether the current $I_L$ flowing through the inductor decreases to essentially zero based on the current signal Sc, and provides the low voltage level driving signal G2 to turn off the transistor M2 at the zero-crossing point (i.e., the inductor current $I_L$ is essentially 0).

In some embodiments, the driving circuit 400 further includes a braking time generating circuit 440 configured to generate a braking time information $T_{CB}$, and to provide the braking time information $T_{CB}$ to the control circuit 420. The control circuit 420 determines the time period that the transistor M2 operates in the linear region based on the braking time information $T_{CB}$, and regulates the voltage value $V_{GS(LS)}$ of the driving signal G2 accordingly. For example, the braking time information $T_{CB}$ indicates the start time of entering a channel braking mode (i.e., the transistor M2 operates in the linear region). In another example, the braking time information $T_{CB}$ indicates the end time of exiting the channel braking mode. The braking time information $T_{CB}$ may further include the time period of the transistor M2 operating in the linear region. In some other examples, the braking time information $T_{CB}$ may be other time parameters related to the channel braking mode (i.e., the transistor M2 operates in the linear region). In one embodiment, the braking time information $T_{CB}$ includes a pulse signal having a rising edge and a falling edge. In another embodiment, the braking time information $T_{CB}$ includes a value of a preset time parameter.

In another embodiment, before the transistor M2 enters the channel braking mode, the transistor M2 is turned off by the control circuit 420 for a period of time to turn on the body diode of the transistor M2. The braking time information $T_{CB}$ generated by the braking time generating circuit 440 may further include the start time of turning on the body diode, the end time of turning off the body diode, and the on-duration of the body diode. In one implementation, the value of the on-duration of the body diode could be set by a program.

Figure 5:
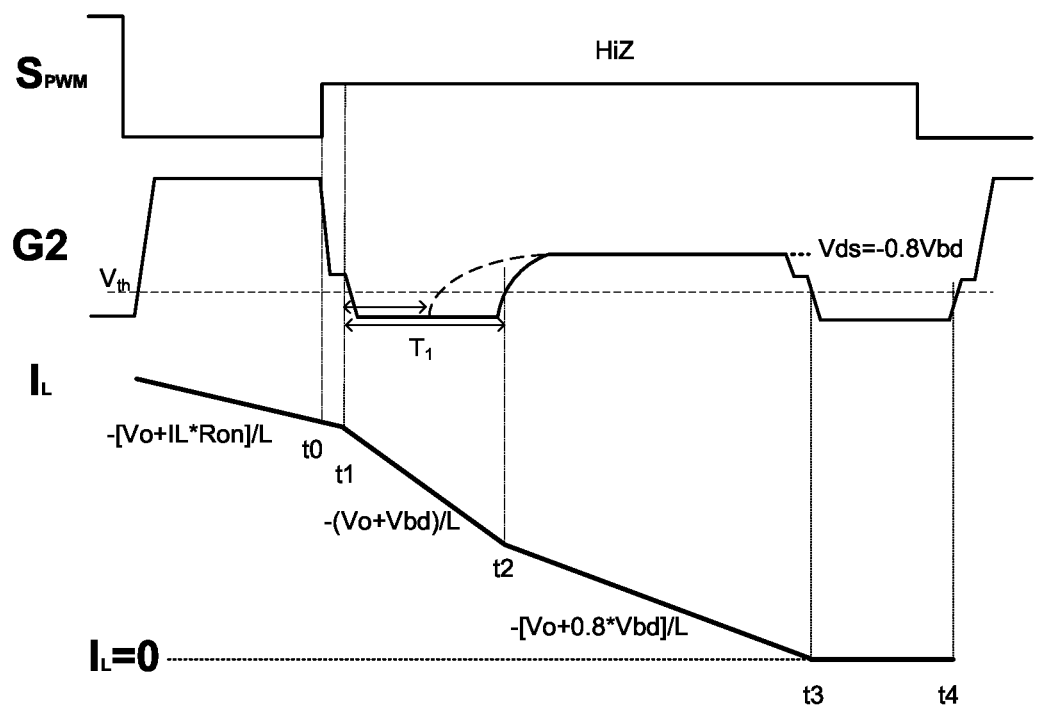
FIG. 5 schematically shows simulated waveforms of signals of a driving circuit shown in FIG. 4 in accordance with an embodiment of the present invention.

Now referring to FIG. 4 and FIG. 5 to illustrate an embodiment of the operation of the driving circuit in the present invention. FIG. 5 schematically shows simulated waveforms of signals of a driving circuit shown in FIG. 4 in accordance with an embodiment of the present invention. As shown in FIG. 5, at time t0, when the controller 310 detects that the load transitions from heavy load to light load or detects the voltage spikes, the controller 310 sends the HiZ command (e.g., the PWM control signal $S_{PWM}$ at the high impedance logic level). In this embodiment, in order to decrease the inductor current $I_L$ at a higher slew rate, when the tri-state detection circuit 410 detects that the PWM control signal $S_{PWM}$ is at the high impedance logic level, the control circuit 420 provides the low voltage level driving signal G2 to the transistor M2. As shown in FIG. 5, at time t0, the voltage value of the driving signal G2 starts to decrease. At time t1, the driving signal G2 decreases to the low voltage level to turn off the transistor M2 ($V_{GS(LS)}<Vth$). At this time, the transistor M2 is turned off for a period of time $T_1$ to decrease the inductor current $I_L$ at a higher slew rate. Besides, turning off the transistor M2 could avoid the ringing caused by the intrinsic parasitic capacitor of the transistor M2. Thus, by turning off the transistor M2 first for a period of time, it is easier to regulate the voltage $V_{GS(LS)}$ of the driving signal G2 to make the voltage $V_{DS(LS)}$ lower than the forward conduction voltage Vbd when the body diode of the transistor M2 is conducted, for example, $V_{DS(LS)}=0.8 \times Vbd$.

In one embodiment, the control circuit 420 determines whether the transistor M2 enters the channel braking mode (i.e., operates in the linear region) according to whether the current $I_L$ flowing through the inductor is greater than a current threshold $I_{CB}$. To be specific, the current sense circuit 430 senses the current signal Sc. The control circuit 420 determines whether the current $I_L$ flowing through the inductor is greater than the current threshold $I_{CB}$ (e.g., 20 A) based on the current signal Sc. If yes, the control circuit 420 provides the driving signal G2 at the low voltage level to turn off the transistor M2 for a period of time, and then regulate the voltage of the driving signal G2 to make the transistor M2 operate in the linear region.

In some embodiments, the off-duration $T_1$ of the transistor M2 may be generated by the braking time generating circuit 440. Persons having ordinary skill in the art may set the time $T_1$ (i.e., the time period from the time point t1 that the PWM control signal $S_{PWM}$ switches to the high impedance logic level to the time point t2 that the transistor M2 operates in the linear region) based on the system and the device parameters according to practical applications. For example, a maximum value (e.g., ≤10 ns) of the time $T_1$ could be set to avoid the substrate current injection issue caused by the conduction of the body diode. In another example, a minimum value of the time $T_1$ could be set to avoid the ringing caused by the intrinsic parasitic capacitor of the transistor M2 during the transistor M2 switches from the on-state to the linear region.

After the time $T_1$ passes, at time point t2, the control circuit 420 increases the voltage of the driving signal G2 from the low level to the target value where the transistor M2 operates in the linear region. At this time, the inductor current $I_L$ continues to decrease with a slew rate lower than the slew rate of when the body diode of the transistor M2 is conducted, but still higher than the slew rate when the transistor M2 is fully turned on. Therefore, the voltage spikes could be suppressed without causing substrate current injection issue.

At time t3, when the control circuit 420 determines that the inductor current $I_L$ decreases to essentially zero based on the current signal Sc, the control circuit 420 provides the low level driving signal G2 to turn off the transistor M2.

At time t4, the voltage of the driving signal G2 provided by the control circuit 420 starts to increase, the off period of the transistor M2 is ended, and the transistor M2 is turned on again.

Figure 6:
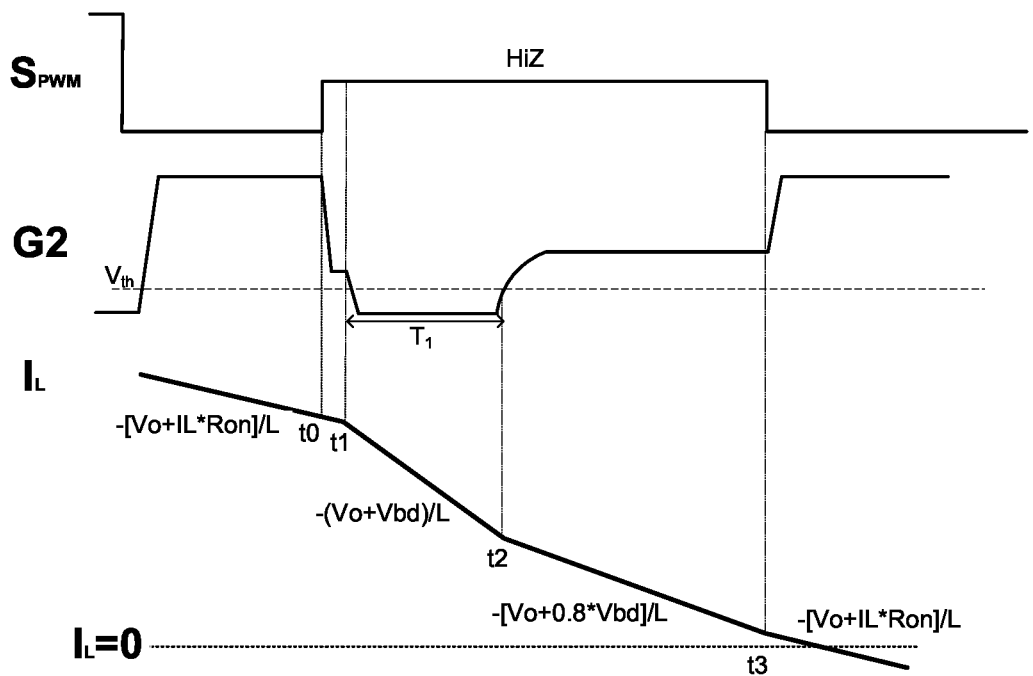
FIG. 6 schematically shows simulated waveforms of signals of the driving circuit shown in FIG. 4 in accordance with another embodiment of the present invention.

FIG. 6 schematically shows simulated waveforms of signals of the driving circuit shown in FIG. 4 in accordance with another embodiment of the present invention. Reference will now be made to FIG. 4 and FIG. 6 to describe the operation of the driving circuit in accordance with another embodiment of the present invention. In this embodiment, when the controller 310 detects that the overshoot of the output voltage is still high and not be suppressed entirely and also the inductor current $I_L$ is not decreased to essentially zero, the controller 310 could send the PWM control signal $S_{PWM}$ at the low logic level to turn on the transistor M2 to generate a negative current for discharging the excess power at the output voltage terminal. As shown in FIG. 6, at time t3, when the inductor current $I_L$ is not decreased to zero, the PWM control signal $S_{PWM}$ switches from the high impedance logic level to the low logic level (which could be indicated by the HiZ command). In one embodiment, PWM control signal $S_{PWM}$ at the low logic level may be provided when the inductor current $I_L$ is still larger than a current threshold (e.g., 5A). At this time, the control circuit 420 provides the high level driving signal G2 to turn on the transistor M2 based on the PWM control signal $S_{PWM}$ at low logic level, thus the inductor current $I_L$ could decreases continuously to generate the negative current for pulling down more current from the output capacitor.

Figure 7A:
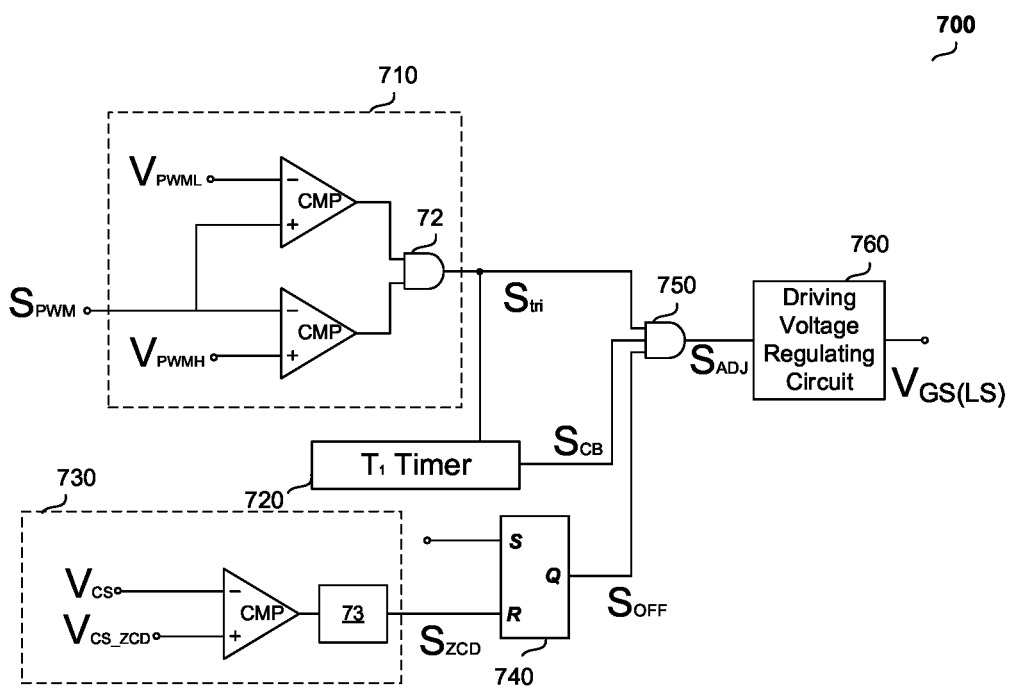
FIG. 7A schematically shows a driving circuit in accordance with yet another embodiment of the present invention.
Figure 7B:
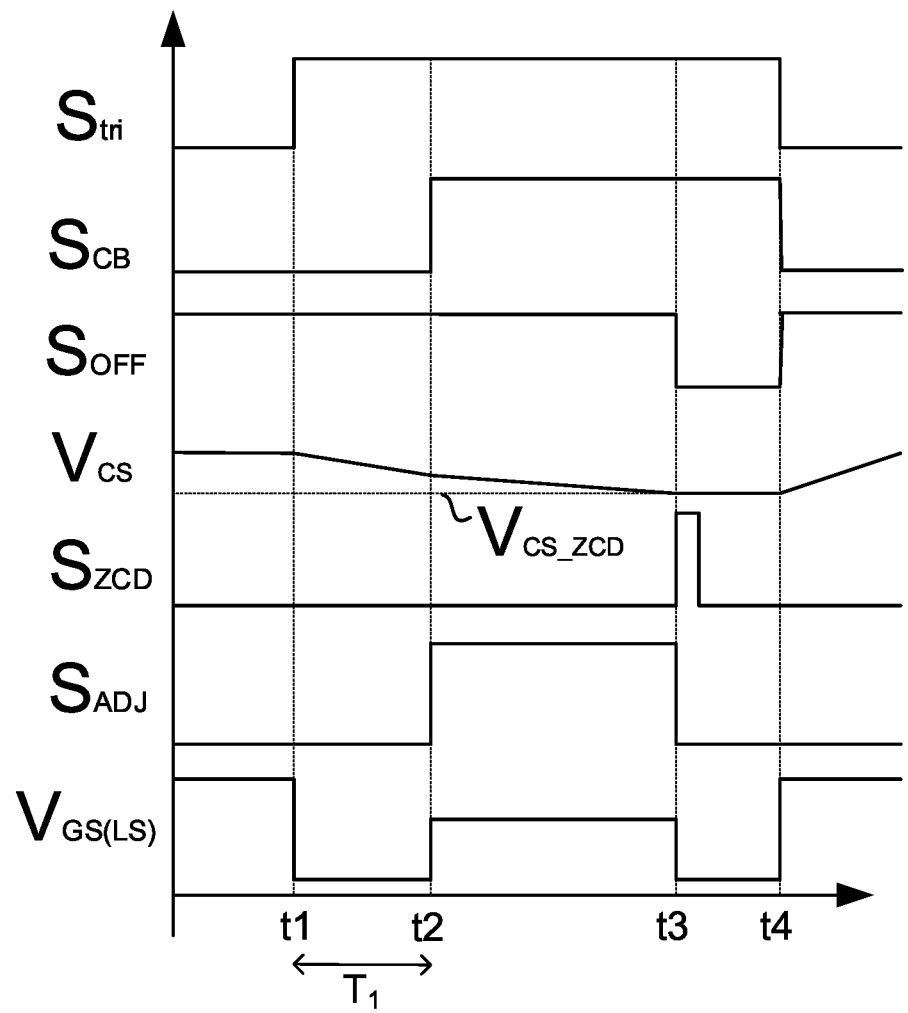
FIG. 7B schematically shows simulated waveforms of signals of the driving circuit shown in FIG. 7A in accordance with an embodiment of the present invention.

Reference will now be made to FIG. 7A and FIG. 7B to describe the operation of the driving circuit in accordance with an embodiment of the present invention. FIG. 7B schematically shows simulated waveforms of signals of the driving circuit shown in FIG. 7A in accordance with an embodiment of the present invention. In this embodiment, the driving circuit 700 includes a tri-state detection circuit 710, a $T_1$ timer 720, a ZCD detection circuit 730, a RS flip-flop 740, an AND gate 750, and a driving voltage regulating circuit 760. As shown in FIG. 7A, the tri-state detection circuit 710 receives the PWM control signal $S_{PWM}$, and determines whether the voltage of the PWM control signal $S_{PWM}$ is between the first voltage threshold and the second voltage threshold. In this embodiment, the tri-state detection circuit 710 includes two comparators CMP and an AND gate 72. If the voltage of the PWM control signal $S_{PWM}$ is higher than the low voltage threshold $V_{PWML}$ (e.g., 1V) and is lower than the high voltage threshold $V_{PWMH}$ (e.g., 2V), the AND gate provides the tri-state signal $S_{tri}$. The $T_1$ timer 720 starts timing after the tri-state signal $S_{tri}$ indicates that the PWM control signal $S_{PWM}$ is at the high impedance logic level (e.g., at time t1 shown in FIG. 7B). After the time $T_1$, the $T_1$ timer 720 generates a high level signal $S_{CB}$ (e.g., at time t2 shown in FIG. 7B). The high level signal $S_{CB}$ may indicate the start time of entering the channel braking mode. That is to say, when the tri-state signal $S_{tri}$ indicates that the PWM control signal $S_{PWM}$ is at the high impedance logic level and the high level signal $S_{CB}$ indicates entering the channel braking mode (e.g., at time t2 shown in FIG. 7B), a high level signal $S_{ADJ}$ is provided by the AND gate 750. At this time (e.g., time t2 shown in FIG. 7B), the driving voltage regulating circuit 760 regulates the driving signal G2 to make the voltage across the transistor M2 (i.e., drain-source voltage $V_{CS(LS)}$) lower than the forward conduction voltage Vbd when the body diode of the transistor M2 is conducted, e.g., $V_{DS(LS)} = -0.8 \times Vbd$.

In one embodiment, the ZCD detection circuit 730 includes a comparator CMP and a one shot circuit 73. In this embodiment, a voltage $V_{CS}$ may indicate the output current $I_{OUT}$ or the current $I_L$ flowing through the inductor. The comparator CMP compares the voltage $V_{CS}$ and the voltage $V_{CS\_ZCD}$. When the voltage $V_{CS}$ is lower than the voltage $V_{CS\_ZCD}$ (i.e., time t3 shown in FIG. 7B), the one shot circuit 73 is triggered to provide zero-crossing signal $S_{ZCD}$ having a single pulse. The flip-flop 740 is reset by the zero-crossing signal $S_{ZCD}$ to provide a low level signal $S_{OFF}$. In other words, when the voltage $V_{CS}$ indicates that the output current $I_{OUT}$ or the current $I_L$ flowing through the inductor decreases to essentially zero, the AND gate 750 provides a low level signal $S_{ADJ}$ (e.g., at time t3 shown in FIG. 7B) to the driving voltage regulating circuit 760, such that the voltage $V_{GS(LS)}$ of the driving signal G2 could be regulated to the low level to turn off the low side switch. In one embodiment, the driving circuit 700 further detects the logic level of the PWM control signal $S_{PWM}$, and sets the flip-flop 740 to provide a high level signal $S_{OFF}$ when the PWM control signal $S_{PWM}$ is at the low logic level.

It should be understood that the driving circuit and the related components, circuit structures, signals, and waveforms described or shown above in the present invention are only for illustration purpose. However, the present invention is not limited thereto. Persons having ordinary skill in the art may understood that the driving circuit of the present invention could be realized, according to practical applications, by any other circuits with different circuit structures, and thus controlled by different types of the corresponding signals to achieve the corresponding functions. For example, the driving circuit 700, the tri-state detection circuit 710, the $T_1$ timer 720, the ZCD detection circuit 730, the flip-flop 740, the AND gate 750, and the driving voltage regulating circuit 760 could be realized by a digital circuit, an analog circuit, a software, an automatic generation circuit by hardware description language, or a combination of the above.

For illustration purpose, the PWM control signal $S_{PWM}$ and the driving signal G2 are switched synchronously. However, the present invention is not limited thereto. In some embodiments, during switching between different states, a delay time may be set between the PWM control signal $S_{PWM}$ and the driving signal G2, or a delay may occur at the rising edge or the falling edge according to the practical application. Thus, the time points of the each signals could be adjusted, or with or without the delay time applied, to perform the function as the driving circuit of the present invention.

Figure 8:
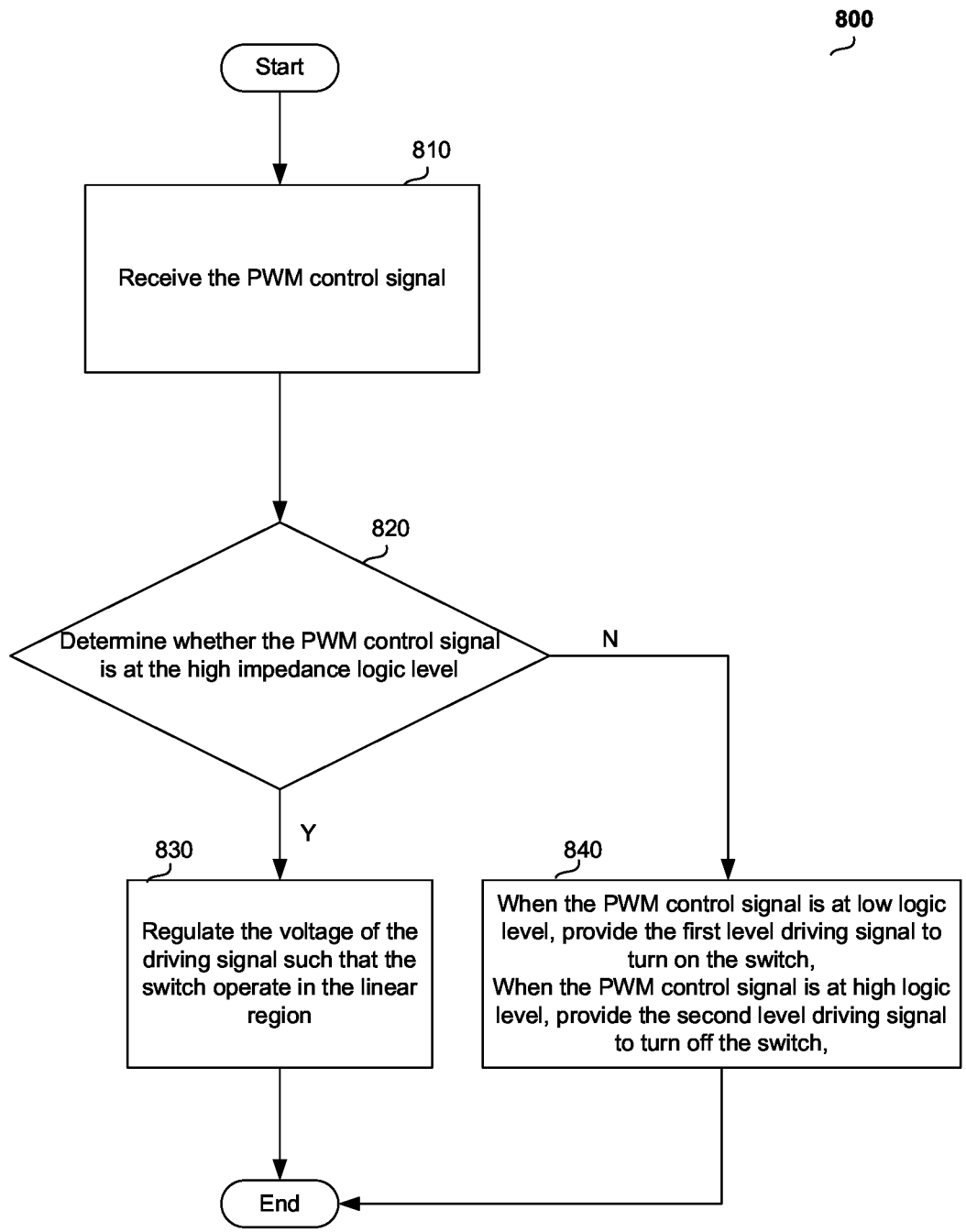
FIG. 8 schematically shows a flowchart of a method for providing a driving voltage in accordance with an embodiment of the present invention.

FIG. 8 schematically shows a flowchart of a method 800 for providing a driving voltage in accordance with an embodiment of the present invention. The method 800 could be performed by the driving circuit as shown in FIG. 1, FIG. 3, FIG. 4, or FIG. 7A. It should be understood that, the method 800 could be performed by the components and elements of the driving circuit as shown in FIG. 3 or FIG. 4, and also could be performed by other driving circuit having different components and elements. The method includes steps 810-840.

In step 810, a PWM control signal is received.

In step 820, whether the PWM control signal is at the high impedance logic level is determined.

Figure 9:
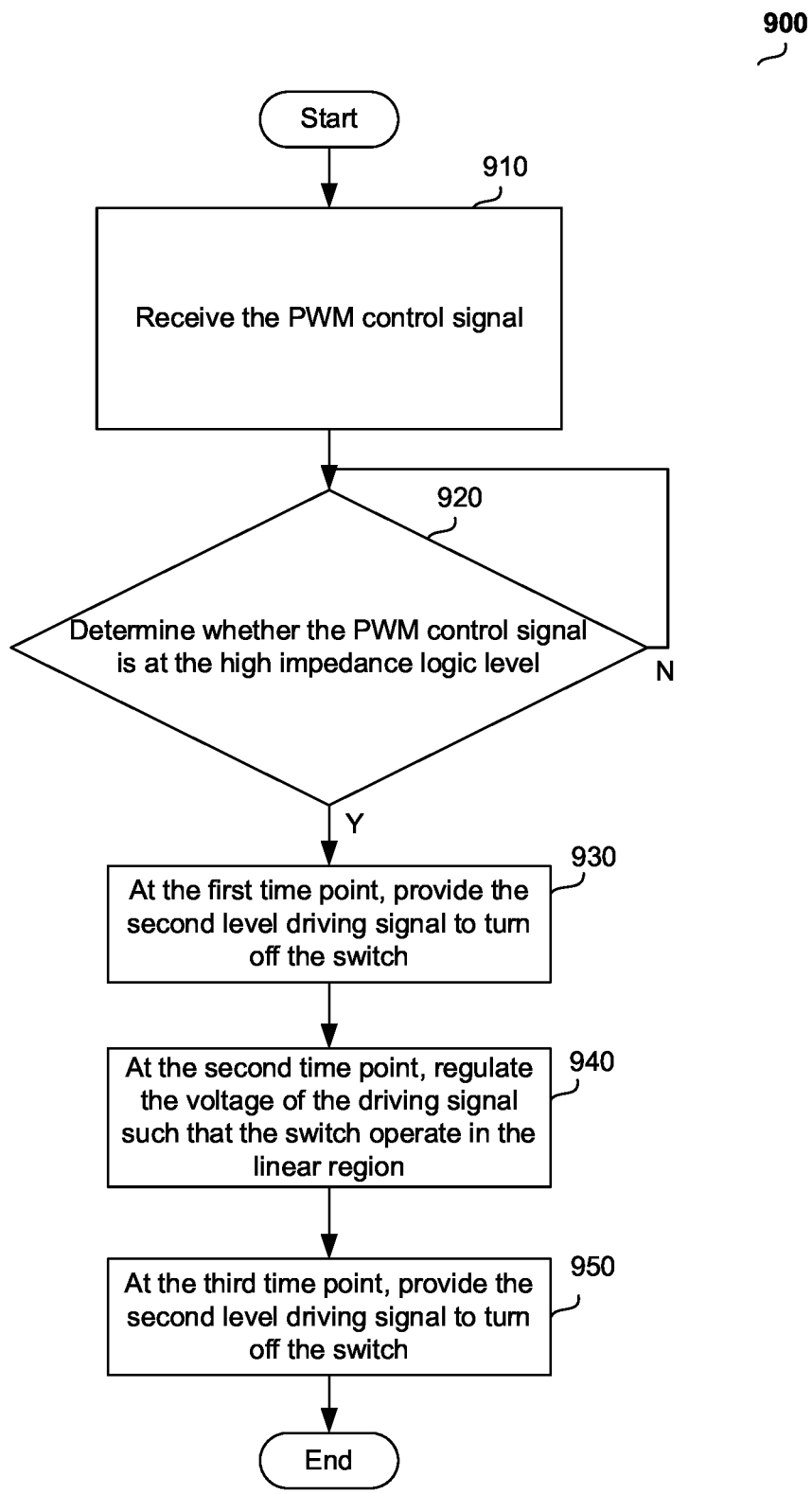
FIG. 9 schematically shows a flowchart of a method for providing a driving voltage in accordance with another embodiment of the present invention.

When the PWM control signal is at the high impedance logic level, in step 830, the voltage of the driving signal is regulated such that the switch operates in the linear region. Otherwise, in step 840, the driving signal is provided to the switch based on the PWM control signal. When the PWM control signal is at low logic level, the first level driving signal is provided to turn on the switch. When the PWM control signal is at high logic level, the second level driving signal is provided to turn off the switch, FIG. 9 schematically shows a flowchart of a method 900 for providing a driving voltage in accordance with another embodiment of the present invention. The method 900 could be performed by the driving circuit as shown in FIG. 1, FIG. 3, FIG. 4, or FIG. 7A. It should be understood that, the method 900 could be performed by the components and elements of the driving circuit as shown in FIG. 3 or FIG. 4, and also could be performed by other circuit having different components and elements. The method includes steps 910-950.

In step 910, a PWM control signal is received.

In step 920, whether the PWM control signal is at the high impedance logic level is determined.

In step 930, when the PWM control signal is at the high impedance logic level, the second level driving signal is provided to turn off the switch at the first time point.

In step 940, when the PWM control signal is at the high impedance logic level, the voltage of the driving signal is regulated such that the switch could operate in the linear region at the second time point.

In step 950, when the PWM control signal is at the high impedance logic level, the second level driving signal is provided to turn off the switch at the third time point.

Power circuits, driving circuits and methods for providing driving voltage are disclosed in the present invention. Although the invention has been described with reference to several exemplary embodiments, it should be understood that by persons skilled in the art that the present invention is not limited to what has been particularly shown and described herein above. Rather the scope of the present invention is defined by the claims and includes both combinations and sub-combinations of the various features described hereinabove as well as variations and modifications thereof which would occur to persons skilled in the art upon reading the foregoing description and which are not in the prior art.

What is claimed is:

1. A power circuit, comprising:
a first switch having a first terminal, a second terminal, and a control terminal, wherein the first terminal of the first switch is configured to receive an input voltage;
a second switch having a first terminal, a second terminal, and a control terminal, wherein the first terminal of the second switch is coupled to the second terminal of the first switch, and the second terminal of the second switch is configured to be coupled to a ground; and
a driving circuit configured to receive a Pulse-Width Modulation (PWM) control signal, and to provide a first driving signal to the control terminal of the first switch and to provide a second driving signal to the control terminal of the second switch based on the PWM control signal, wherein the driving circuit is further configured to determine whether the PWM control signal is at a high impedance logic level; and
wherein when the PWM control signal is at a low logic level, the driving circuit is further configured to provide the second driving signal with a first level to the second switch to turn on the second switch; wherein when the PWM control signal is at a high logic level, the driving circuit is further configured to provide the second driving signal with a second level to the second switch to turn off the second switch; and wherein when the PWM control signal is at the high impedance logic level, a voltage of the second driving signal is regulated to make the second switch operate in a linear region.

2. The power circuit of claim 1, wherein the power circuit further comprises:
a tri-state detection circuit configured to receive the PWM control signal and to determine whether a voltage of the PWM control signal is between a first voltage threshold and a second voltage threshold, wherein the first voltage threshold is lower than the second voltage threshold, the first voltage threshold indicates the low logic level, and the second voltage threshold indicates the high logic level; and
wherein when the voltage of the PWM control signal is between the first voltage threshold and the second voltage threshold, the PWM control signal is determined to be at the high impedance logic level.

3. The power circuit of claim 1, wherein the second switch includes a transistor having a body diode, and wherein when the PWM control signal is at the high impedance logic level, a voltage across the second switch is lower than a forward conduction voltage of the body diode.

4. The power circuit of claim 2, wherein the first terminal of the second switch is coupled to an output voltage terminal through an inductor, and the driving circuit further comprises:
a current sense circuit configured to sense a current signal, wherein the current signal indicates a current flowing through the inductor; and
a control circuit configured to regulate the voltage of the second driving signal to make the second switch operate in the linear region when the tri-state detection circuit determines that the PWM control signal is at the high impedance logic level, to perform a zero current detection based on the current signal, and to provide the second driving signal with the second level to turn off the second switch when the current signal indicates an essentially zero current.

5. The power circuit of claim 1, wherein when the PWM control signal is at the high impedance logic level, the control circuit is further configured to provide the second driving signal with the second level to turn off the second switch at a first time point; and to regulate the voltage of the second driving signal to make the second switch operate in the linear region at a second time point, wherein the second time point is after the first time point.

6. The power circuit of claim 5, wherein the control circuit is further configured to provide the second driving signal with the first level to turn on the second switch at a third time point, wherein the third time point is after the second time point.

7. The power circuit of claim 5, wherein the driving circuit further comprises:
a braking time generating circuit configured to generate a braking time information, wherein the braking time information comprises a time period from the first time point to the second time point.

8. A driving circuit for a voltage regulation circuit, comprising:
a tri-state detection circuit configured to receive a PWM control signal and to determine whether a voltage of the PWM control signal is between a first voltage threshold and a second voltage threshold; wherein when the PWM control signal is between the first voltage threshold and the second voltage threshold, the tri-state detection circuit determines the PWM control signal is at a high impedance logic level and provides a tri-state signal, wherein the first voltage threshold is lower than the second voltage threshold, the first voltage threshold indicates a low logic level, and the second voltage threshold indicates a high logic level; and
a control circuit configured to receive the PWM control signal and to provide a first driving signal to a first switch of the voltage regulation circuit and provide a second driving signal to a second switch of the voltage regulation circuit based on the PWM control signal; and
wherein when the PWM control signal is at the low logic level, the control circuit is configured to provide the second driving signal with a first level to turn on the second switch; wherein when the PWM control signal is at the high logic level, the control circuit is configured to provide the second driving signal with a second level to turn off the second switch; and the control circuit is configured to regulate a voltage of the second driving signal to make the second switch operate in the linear region based on the tri-state signal.

9. A driving circuit of claim 8, wherein the second switch includes a transistor having a body diode, and wherein when the PWM control signal is at the high impedance logic level, a voltage across the second switch is lower than a forward conduction voltage of the body diode.

10. The driving circuit of claim 8, wherein a first terminal of the second switch is coupled to an output voltage terminal of the voltage regulation circuit through an inductor, and the driving circuit further comprises:
a current sense circuit configured to sense a current signal, wherein the current signal indicates a current flowing through the inductor; and
wherein the control circuit is configured to perform a zero current detection based on the current signal, and to provide the second driving signal with the second level to turn off the second switch when the current signal indicates an essentially zero current.

11. The driving circuit of claim 8, wherein when the PWM control signal is at the high impedance logic level, the control circuit is further configured to provide the second driving signal with the second level to turn off the second switch at a first time point; and to regulate the voltage of the second driving signal to make the second switch operate in the linear region at a second time point, wherein the second time point is after the first time point.

12. The driving circuit of claim 11, wherein the control circuit is further configured to provide the second driving signal with the first level to turn on the second switch at a third time point, wherein the third time point is after the second time point.

13. The driving circuit of claim 11, further comprising:
a braking time generating circuit configured to generate a braking time information, wherein the braking time information comprises a time period from the first time point to the second time point.

14. A method for providing a driving voltage, comprising:
receiving a PWM control signal;
determining whether the PWM control signal is at a high impedance logic level; and
providing a driving signal to a switch based on the PWM control signal; and wherein
when the PWM control signal is at a low logic level, providing the driving signal with a first level to turn on the switch;
when the PWM control signal is at a high logic level, providing the driving signal with a second level to turn off the switch; and
when the PWM control signal is at the high impedance logic level, regulating a voltage of the driving signal to make the switch operate in a linear region.

15. The method of claim 14, wherein determining whether the PWM control signal is at the high impedance logic level further comprises:
determining whether a voltage of the PWM control signal is between a first voltage threshold and a second voltage threshold, wherein the first voltage threshold is lower than the second voltage threshold, the first voltage threshold indicates the low logic level, and the second voltage threshold indicates the high logic level; and
wherein when the voltage of the PWM control signal is between the first voltage threshold and the second voltage threshold, the PWM control signal is at the high impedance logic level.

16. The method of claim 14, wherein the switch has a body diode, wherein when the PWM control signal is at the high impedance logic level, a voltage across the switch is lower than a forward conduction voltage of the body diode.

17. The method of claim 14, wherein the switch is coupled to an output voltage terminal through an inductor, further comprising:
detecting a current signal indicating a current flowing through the inductor; and
performing a zero current detection to provide the driving signal with the second level to turn off the switch when the current signal indicates an essentially zero current.

18. The method of claim 14, wherein regulating the voltage of the driving signal to make the switch operate in the linear region further comprises:
when the PWM control signal is at the high impedance logic level, providing the driving signal with the second level to turn off the switch at a first time point;
when the PWM control signal is at the high impedance logic level, regulating the voltage of the driving signal to make the switch operate in the linear region at a second time point, wherein the second time point is after the first time point.

19. The method of claim 18, further comprising:
providing the driving signal with the first level to turn on the switch at a third time point, wherein the third time point is after the second time point.

20. The method of claim 18, further comprising:
providing a time period between the first time point to the second time point.

\* \* \* \* \*